(12) United States Patent
Sakamoto (10) Patent No.: US 7,368,868 B2
(45) Date of Patent: May 6, 2008

(54) ACTIVE MATRIX ORGANIC EL DISPLAY PANEL

(75) Inventor: Yoshiaki Sakamoto, Kawasaki (JP)

(73) Assignee: FUJIFILM Corporation, Tokyo (JP)

( * ) Notice: Subject to any disclaimer, the term of this patent is extended or adjusted under 35 U.S.C. 154(b) by 54 days.

(21) Appl. No.: 11/083,025

(22) Filed: Mar. 18, 2005

(65) Prior Publication Data
US 2005/0162079 A1    Jul. 28, 2005

Related U.S. Application Data

(63) Continuation of application No. PCT/JP03/01464, filed on Feb. 13, 2003.

(51) Int. Cl.
   *H05B 33/08* (2006.01)
   *H05B 33/06* (2006.01)
   *H01L 51/50* (2006.01)

(52) U.S. Cl. .............. 313/505; 313/500; 313/503; 315/169.3

(58) Field of Classification Search ......... 313/500–512
   See application file for complete search history.

(56) References Cited

U.S. PATENT DOCUMENTS

| | | | |
|---|---|---|---|
| 6,429,599 B1 * | 8/2002 | Yokoyama | 313/504 |
| 6,456,013 B1 | 9/2002 | Komiya et al. | |
| 2002/0070909 A1 | 6/2002 | Asano et al. | |
| 2002/0074580 A1 | 6/2002 | Anzai et al. | |
| 2002/0075254 A1 | 6/2002 | Anzai | |
| 2002/0084746 A1 * | 7/2002 | Anzai | 313/504 |
| 2002/0101394 A1 | 8/2002 | Anzai | |
| 2006/0097628 A1 * | 5/2006 | Suh et al. | 313/504 |

FOREIGN PATENT DOCUMENTS

| | | |
|---|---|---|
| EP | 0 955 791 A1 | 11/1999 |
| EP | 1006586 A2 * | 6/2000 |
| EP | 1006588 A2 | 6/2000 |
| JP | 60-218626 | 11/1985 |
| JP | 2000-148087 | 5/2000 |
| JP | 2000-214800 | 8/2000 |
| JP | 2001-85162 | 3/2001 |
| JP | 2002-56972 | 2/2002 |
| JP | 2002-215063 | 7/2002 |
| JP | 2002-221917 | 8/2002 |
| WO | WO-99/20080 | 4/1999 |

OTHER PUBLICATIONS

European Search Report dated Feb. 6, 2008, issued in corresponding European Patent Application No. 03705089.

* cited by examiner

*Primary Examiner*—Mariceli Santiago
(74) *Attorney, Agent, or Firm*—Westerman, Hattori, Daniels & Adrian, LLP.

(57) ABSTRACT

A display device having a bottom emission type, active matrix organic EL panel that efficiently secures a sufficient aperture ratio, has pixel arrangement in which the aperture ratio is not a trade off for higher resolution, and can operate with reduced power consumption and contribute to downsizing of the driving circuit and the device as a whole. The display device includes an active matrix organic EL panel having first and second electrodes provided on a substrate and an organic EL light emitting layer provided between the first and second electrodes. The organic EL light emitting layer includes a light emitting region, a plurality of the light emitting regions are arranged such that adjacent ones of the light emitting regions do not contact each other.

7 Claims, 8 Drawing Sheets

FIG. 1

I – I' SECTION

II–II' SECTION | III–III' SECTION

FORMING SUBSTRATE

FIG. 6B

FORMING FIRST ELECTRODE

FIG. 6C

FORMING ORGANIC EL LIGHT EMITTING LAYER (R)

FIG. 6D

FORMING ORGANIC EL LIGHT EMITTING LAYER (G)

FIG. 6E

FORMING ORGANIC EL LIGHT EMITTING LAYER (B)

FIG. 6F

FORMING SECOND ELECTRODE

FIG. 6G

SEALING/CONNECTING LINES    LIGHT EMISSION    CONNECTED TO DRIVING CIRCUIT

ACTIVE MATRIX ORGANIC EL DISPLAY PANEL

This application is a continuation of international application PCT/JP03/01464 filed on Feb. 13, 2003.

TECHNICAL FIELD

The present invention relates to display devices that use organic EL (Electro-Luminescence), and more particularly, is applied to a bottom emission type, active matrix organic EL panel.

BACKGROUND ART

In recent years, organic EL displays that employ an organic EL system in which carriers are injected into an organic solid from an electrode to emit light from a flat surface have actively been developed as light-emitting type displays. The organic EL displays can be divided into passive matrix type and active matrix type, for example, depending on how the displays are driven. The former type display allows pixels arranged in a matrix to emit light by line-at-a-time driving method. The latter type has a switching element for each of pixels arranged in a matrix and the switching elements are controlled to drive the pixels so that they emit light individually.

According to the driving method by the active matrix type organic EL display, the switching circuits control light emission of the pixels on a pixel basis, and therefore the display has attracted attention particularly as an optimum display for moving picture. There are bottom emission type displays that extract emitted light toward the glass substrate and the top emission type displays that extract emitted light to the opposite side to the glass substrate.

A bottom emission type, active matrix organic EL panel is provided with a switching circuit on a pixel basis, and light is emitted toward the glass substrate. Therefore, the part of the switching circuits that occupies half the area of the pixel inevitably becomes a non-light emitting region. In addition, three light emitting regions for three colors R (red), G (green), and B (blue) that are necessary for full color display are produced by coloring the organic EL light emitting layer discretely corresponding to the colors. Therefore, a registration margin (dm) for discrete coloring between adjacent light emitting regions in different colors is necessary, and this dm portion constitutes a non-light emitting region.

Figure 4:
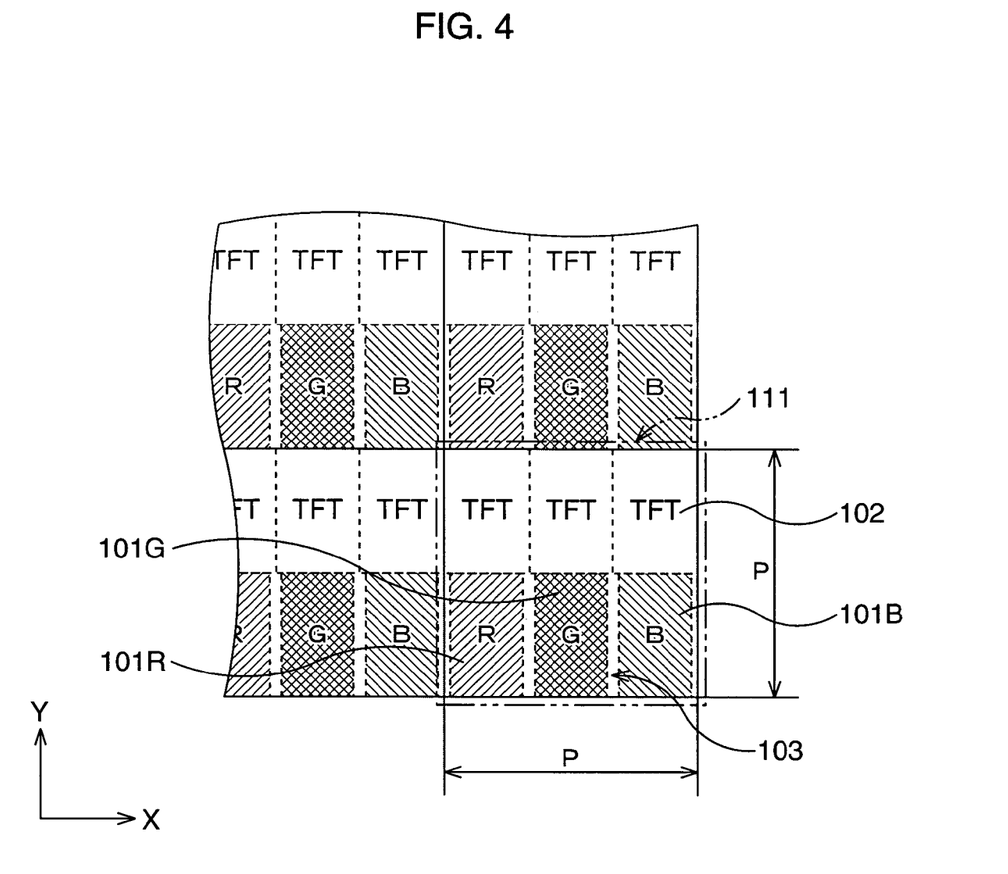
FIG. 4 is a schematic plan view of an example of pixel arrangement in a conventional bottom emission type, active matrix organic EL display.

In a conventional display, the three light emitting regions for R, G, and B and the switching circuit portions are arranged continuously based on the colors (see FIG. 4 for the arrangement in the horizontal (X-) direction). As the registration margin (dm) depends on the registration precision by the pixel film deposition device and the processing precision of the pattering mask, how much the registration margin (dm) can be reduced is limited, and the minimum value for the margin dm is generally 20 μm (corresponding to ±10 μm). In this case, the width of each light emitting region is smaller as the resolution increases. However, the minimum value for dm is fixed, and therefore the ratio of dm occupied in the pixel increases, which lowers the ratio of the light emitting regions (aperture ratio) if higher resolution is to be achieved. With a smaller aperture ratio, the luminance is lowered, and therefore the amount of current that contributes to the light emission should be increased to keep the luminance in a necessary level. This gives rise to increase in power consumption.

The present invention was devised in view of the above described problems, and it is an object of the present invention to provide a display device having a bottom emission type, active matrix organic EL panel that efficiently secures a sufficient aperture ratio, has pixel arrangement in which the aperture ratio is hardly a trade off for higher resolution, and can operate with reduced power consumption for obtaining necessary luminance and contribute to downsizing of the driving circuit and the device as a whole, and a manufacturing method that allows the configuration of such a display device to be readily provided with reliability.

SUMMARY OF THE INVENTION

A display device according to the invention includes an active matrix organic EL panel having first and second electrodes provided on a substrate and an organic EL light emitting layer provided between the first and second electrodes. The organic EL light emitting layer includes a light emitting region, a plurality of the light emitting regions are arranged in a zigzag manner, and adjacent ones of the light emitting regions are kept from contacting each other.

By a method of manufacturing a display device according to the invention, a display device is produced that includes an active matrix organic EL panel having first and second electrodes provided on a substrate and an organic EL light emitting layer provided between the first and second electrodes. The organic EL light emitting layer includes a light emitting region. At the time of forming a plurality of the light emitting regions, the organic EL light emitting layers corresponding to the respective light emitting regions are formed by mask vapor deposition so that they are arranged in a zigzag manner and adjacent ones of the light emitting regions are kept from contacting each other.

DETAILED DESCRIPTION OF THE PREFERRED EMBODIMENTS

Hereinafter, specific embodiments of the invention will be described in detail with reference to the accompanying drawings.

Now, a preferred embodiment of the invention will be described in detail with reference to the accompanying drawings. The embodiment is mainly directed to a display device including a bottom emission type, active matrix organic EL panel (bottom emission type, active matrix organic EL display).

Specific Configuration of Organic EL Display

Figure 1:
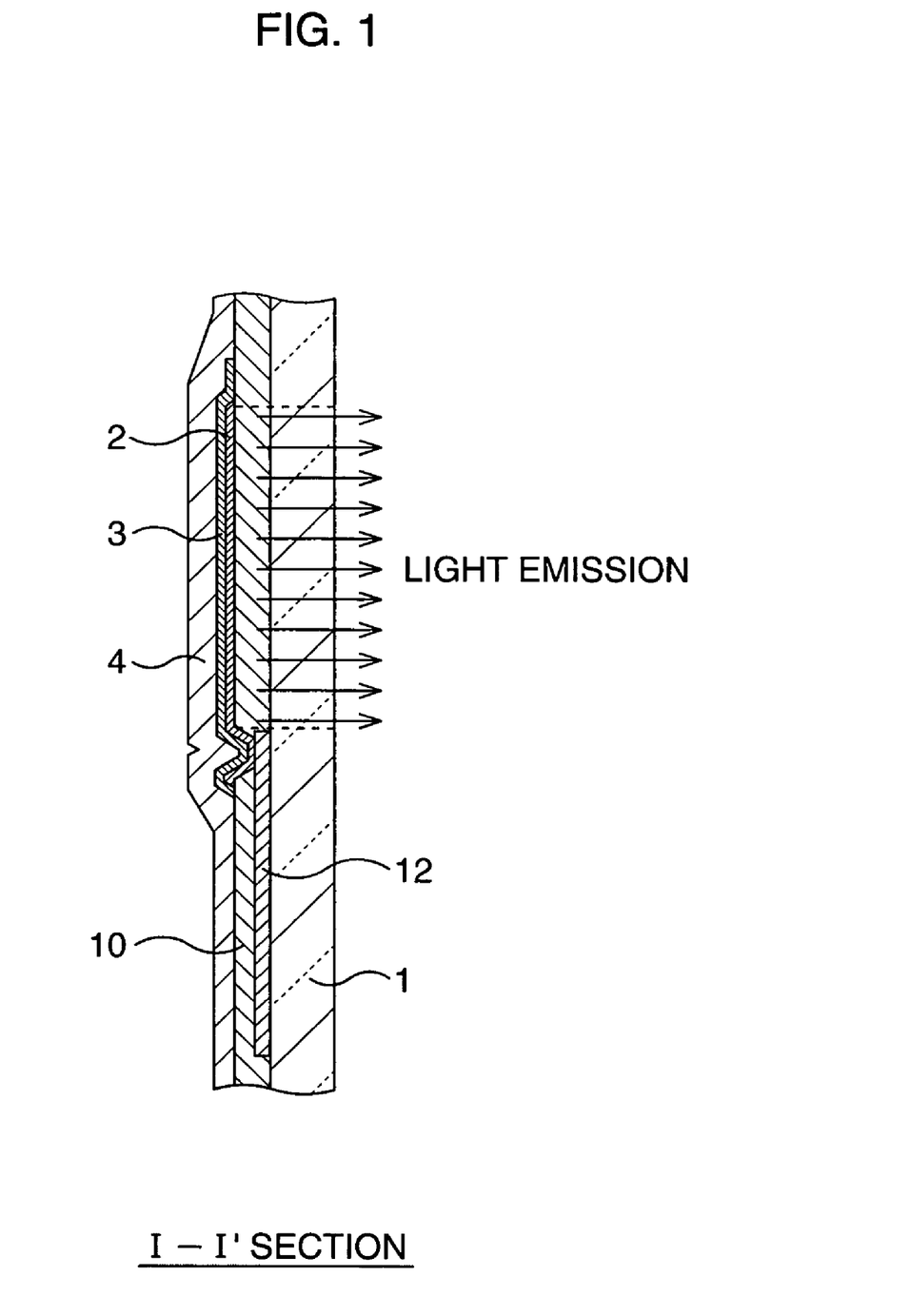
FIG. 1 is a schematic sectional view of an organic EL layer in an organic EL display according to an embodiment of the invention.
Figure 2:
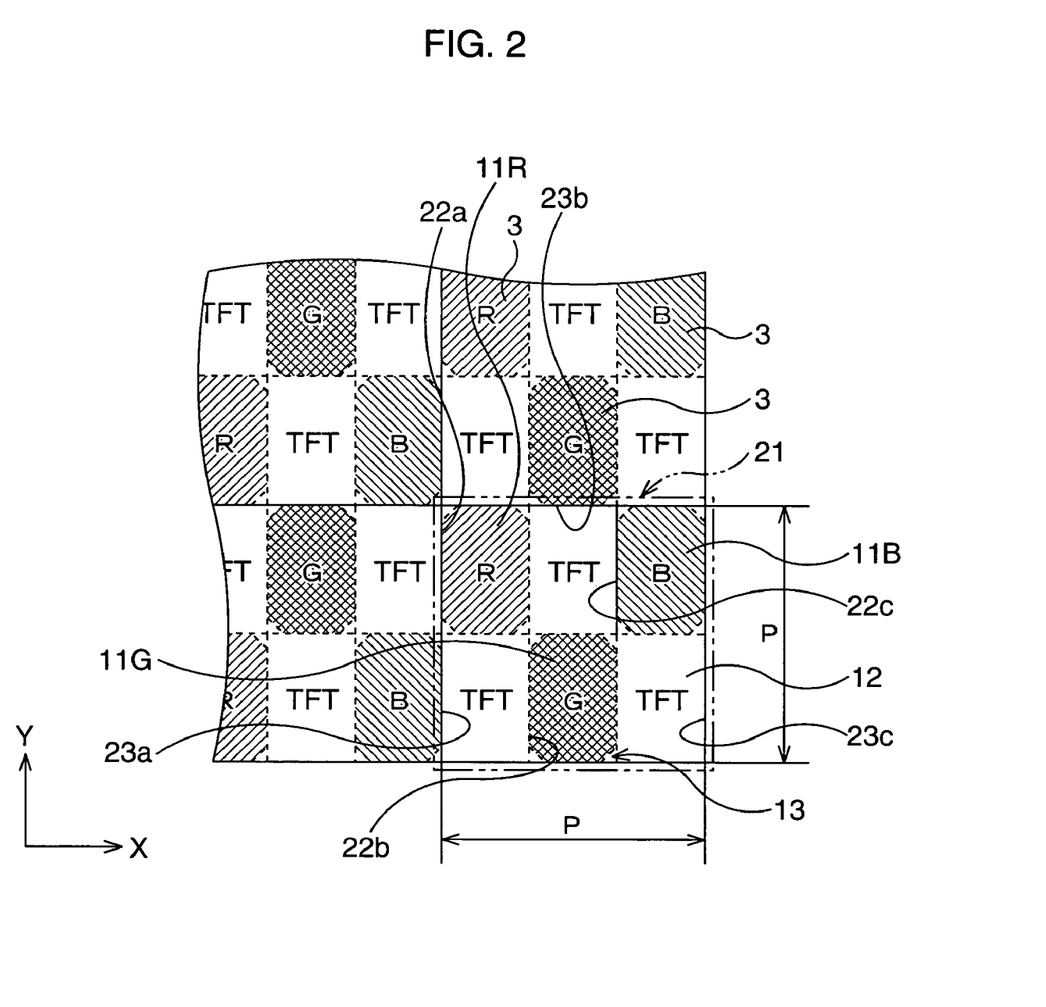
FIG. 2 is a schematic plan view of an organic EL light emitting layer, a main part of the organic EL display according to the embodiment, showing its surface as being enlarged.
Figure 3:
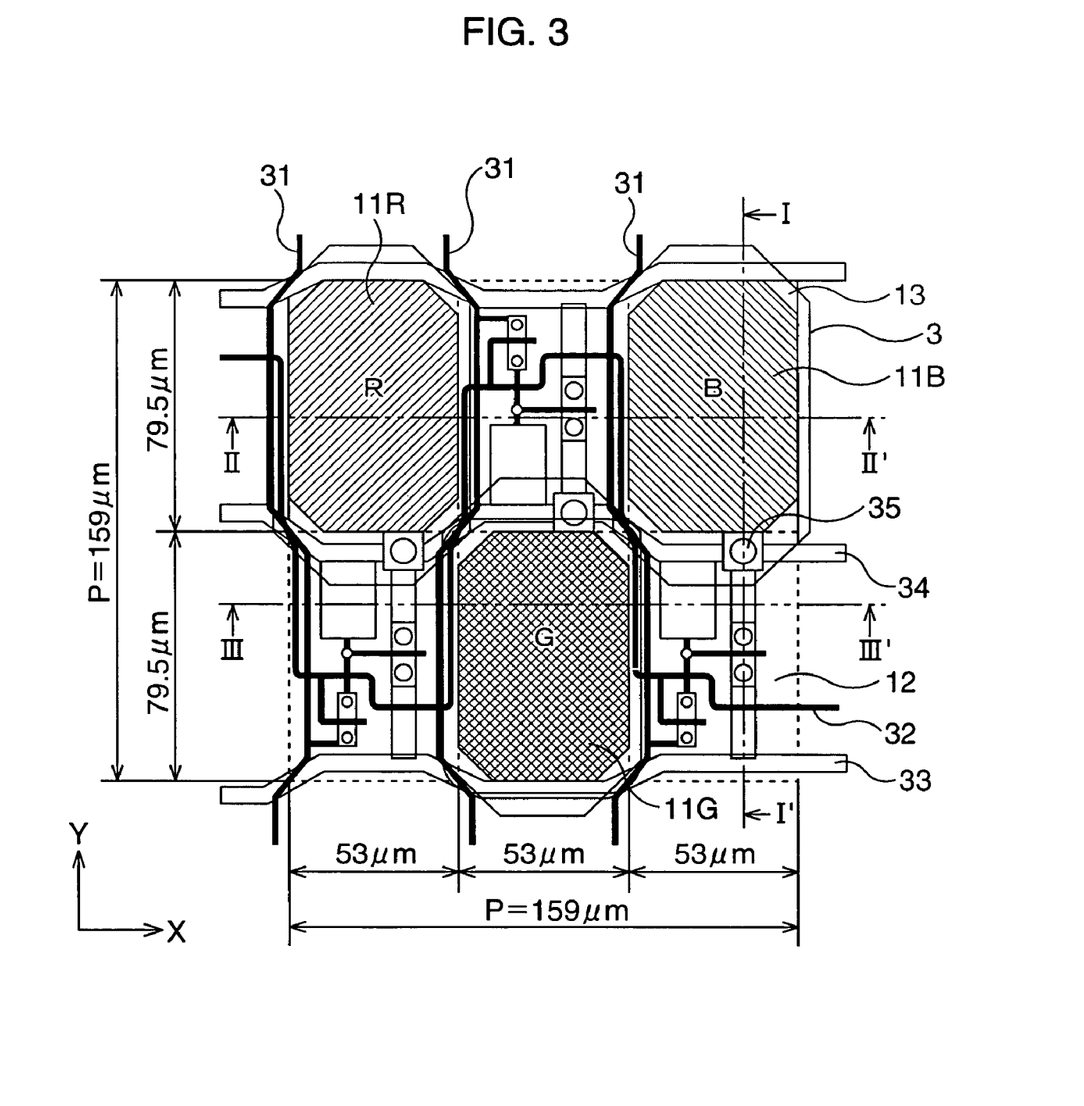
FIG. 3 is a schematic plan view of the pixel unit in FIG. 2 as being enlarged.

FIG. 1 is a schematic sectional view of the configuration of the panel of the organic EL display according to the embodiment, FIG. 2 is a schematic plan view of an organic EL light emitting layer, a main component of the organic EL display according to the embodiment, showing its surface as being enlarged, and FIG. 3 is a schematic plan view of pixels in FIG. 2 as being enlarged. Here, FIG. 1 shows a section taken along the line I-I' in FIG. 3.

As shown in FIG. 1, the organic EL display includes a TFT (Thin Film Transistor) element 12 as a switching circuit that controls light emission, for example, on a glass substrate 1 as a transparent substrate. The TFT element 12 and the interconnection lines are protected and insulated by a flattening film 10 that forms a flat surface on which an organic EL element is to be stacked. A plurality of first electrodes 2 made of a material containing, for example, an indium tin oxide (ITO) alloy as transparent electrodes, a plurality of organic EL layers 3 corresponding to the respective first electrodes 2, and a second electrode 4 made of a material containing aluminum or the like and covering the entire surface are stacked on the flat surface. The organic EL layers 3 are held between the associated first electrodes 2 and the second electrode 4, and the fist electrode 2 and the TFT element 12 are connected by a through hole provided at part of the flattening film 10. In this case, the area of the organic EL layer 3 is formed to be larger than the area of the first electrode 2. At the time of driving, light is emitted from the organic EL layer 3 through the first electrode 2 and the glass substrate 1.

As shown in FIG. 2, a plurality of pixels 21 are arranged in a matrix, and the pixels 21 each include a plurality of light emitting regions 11R, 11G, and 11B corresponding to R, G, and B, and a plurality of TFT elements 12 provided corresponding to the light emitting regions and serving as switching circuits that control light emission from the respective light emitting regions. Here, the overlapping parts between the first electrodes 2 and the organic EL layers 3 are the light emitting regions 11R, 11G, and 11B. The light emitting regions 11R, 11G, and 11B are arranged in a zigzag manner, and non-light emitting regions 13 provided at corners of the light emitting regions prevent adjacent ones among the light emitting regions 11R, 11G, and 11B from contacting each other. One pixel 21 is in the shape of a regular square of P×P. The pixels 21 are each divided in two in the vertical direction and three in the horizontal direction into six segments 22a to 22c and 23a to 23c. The light emitting regions 11R, 11G, and 11B are provided in the three zigzagged segments 22a to 22c, and the TFT elements 12 are in the remaining three segments 23a to 23c. Herein, the light emitting regions in the same color are aligned in the vertical direction (Y-direction) with each TFT element 12 interposed therebetween.

Now, as a comparative example to the embodiment, pixel arrangement in a conventional bottom emission type, active matrix organic EL display is shown in FIG. 4.

As can be seen, in the conventional example, the light emitting regions 101R, 101G, and 101B constituting the pixel 111 are aligned in the horizontal direction (X-direction), and therefore adjacent light emitting regions are separated by the non-light emitting regions 103 provided at vertical sides of the light emitting regions and the TFT elements 102. Therefore, how much the area of the non-light emitting regions 103 can be reduced is necessarily limited.

In comparison, according to the embodiment, the light emitting regions 11R, 11G, and 11B are provided with notches, in C-chamfer shape in this example (though they may be rounded), as the non-light emitting regions 13 at their respective four corners. The non-light emitting regions 13 and the TFT circuits 12 keep adjacent light emitting regions from contacting one another. The non-light emitting regions 13 formed at the corners of the light emitting regions occupy only an extremely small area, and the aperture ratio can be improved significantly over that of the example in FIG. 4.

Based on this pixel arrangement, a size for a resolution of 160 ppi will be described with reference to FIG. 3. It is understood that the size is simply by way of example and the invention is not limited thereto.

When the resolution is 160 ppi, P=159 μm, and therefore the regions occupied by the colors R, G, and B are each 159 μm×53 μm, half the area, 79.5 μm×53 μm is the area occupied by a TFT element 12, and the remaining 79.5 μm×53 μm is the area occupied by each light emitting region. So-called C-chamfers are provided as non-light emitting regions 13 at the corners of the light emitting regions in order to secure registration margins necessary for discrete coloring in three colors and a space for various interconnection lines for switching circuits. The registration margin dm necessary for discrete coloring is 20 μm (±5 μm for the registration margin by the pixel film deposition device plus ±5 μm for the processing precision for the R, G, and B patterning mask). The necessary interconnection lines include a data line 31, a scanning line 32, a power supply line 33, and a storage capacitor line 34, and these lines each have a width in the range of from 5 μm to 15 μm. The data line 31 is provided in the Y-direction, and the scanning line 32, the power supply line 33, and the storage capacitor line 34 are provided in the X-direction. These interconnection lines in the TFT element 12 are formed in different layers formed as multiple film layers and connected with each other by a through hole 35 provided in interlayer insulating films. Therefore, a chamfer of C15 μm provided at the corner of each light emitting region allows the registration margin and the space for the interconnection lines to be secured.

In order to form the light emitting regions, the first electrode 2 as the transparent electrode on the glass substrate has a rectangular shape of 79.5 μm×53 μm, and each corner is chamfered by C15 μm. Consequently, the segment for each color has an area of 159 μm×53 μm=8427 μm², while the area of the effective light emitting region is 79.5 μm×53 μm−C15 μm×4=3763.5 μm². The aperture ratio is (3763.5/8427)×100=44.7%.

In contrast, in the comparative example of FIG. 4, the segment width of each of the R, G, and B light emitting regions is P/3 relative to the pixel pitch P, and if the registration margin dm for discrete coloring is secured, the width of the light emitting region is P/3−dm. If the lower limit for the registration margin dm for discrete coloring is applied to design higher resolution arrangement, the ratio of reduction in the width of the light emitting region by dm increases as the pitch P is reduced, and the aperture ratio is reduced.

When, for example, P=318 μm (for a resolution of 80 ppi), and dm=20 μm, the size of the light emitting region L×W=159 μm×86 μm, and the aperture ratio is 40.6%. When P=159 μm (for a resolution of 160 ppi), and dm=20 μm, L×W=79.5 μm×33 μm and the aperture ratio is 31.1%. This means that the aperture ratio is greatly reduced by the registration margin dm if higher resolution is to be obtained.

Figure 5:
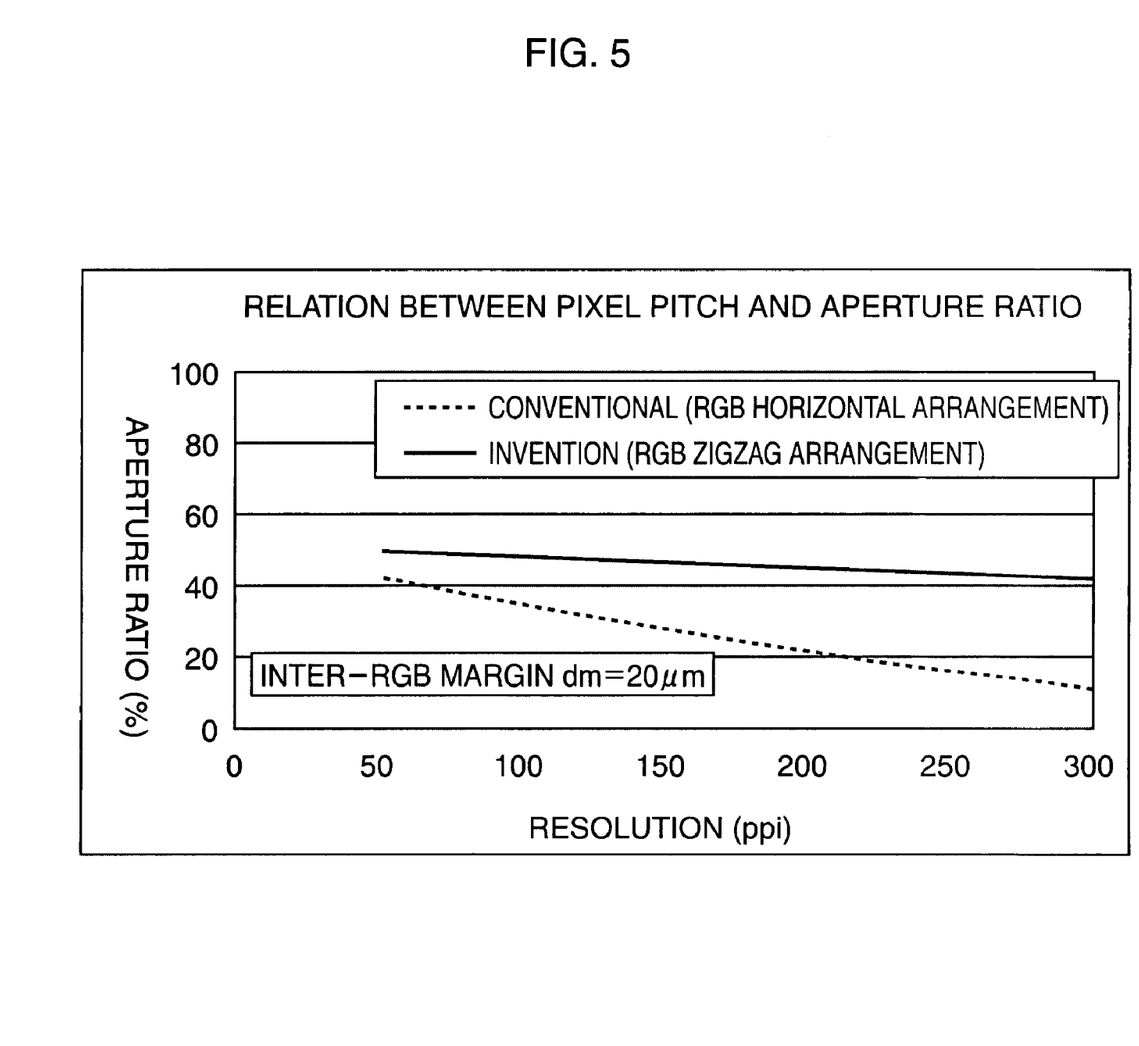
FIG. 5 is a graph showing a result of examining the relation between increase in the pixel resolution and the aperture ratio in comparison with the conventional example (comparative example).

The organic EL display according to the embodiment having the above-described configuration was compared to the conventional example (the comparative example described above) regarding the relation between increase in the pixel resolution and the aperture ratio. The result is given in FIG. 5. As can be seen, when the registration margin dm necessary for discrete coloring is 20 µm, the aperture ratio in the configuration according to the present embodiment is significantly greater than that of the conventional example regardless of the value of the resolution. It has been found that the configuration according to the embodiment considerably, effectively improves the aperture ratio in the bottom emission type, active matrix organic EL panel.

In this way, the present embodiment can improve the aperture ratio by 13.6% over the comparative example. Therefore, according to the embodiment, a display having a bottom emission type, active matrix organic EL panel that efficiently secures a sufficient aperture ratio, has pixel arrangement in which the aperture ratio is hardly a trade off for higher resolution, and can operate with reduced power consumption for obtaining necessary luminance and contribute to downsizing of the driving circuit and the device as a whole can be provided.

Specific Example of Method of Manufacturing Organic EL Display

FIGS. 6A to 6G are schematic sectional views showing main steps in the process of manufacturing the organic EL display according to the embodiment in the order of the steps. In FIGS. 6A to 6G, the left side on the surface of the sheet corresponds to a section taken along the line II-II' in FIG. 3, and the right side corresponds to a section taken along line III-III' in FIG. 3.

Figure 6A:
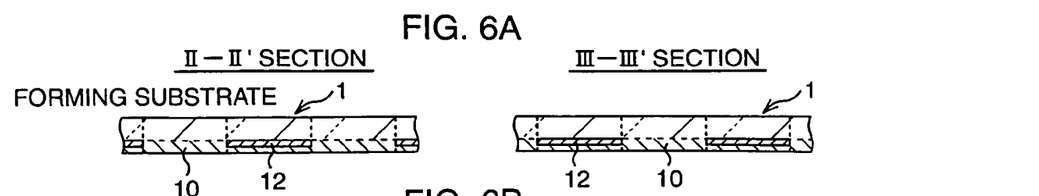
FIGS. 6A to 6G are schematic sectional views showing main steps in the process of manufacturing the organic EL display according to the embodiment in the order of the steps.

Now, as shown in FIG. 6A, on the surface of, for example, a glass substrate 1 as a transparent substrate, a TFT element 12 serving as a switching circuit, and various interconnection lines such as a data line 31, a scanning line 32, a power supply line 33, and a storage capacitor line 34 are formed, and then a flattening film 10 made of a transparent resin is formed to cover them. Here, the TFT elements 12 are formed in the parts corresponding to the segments 23a to 23c of the pixel 21 as described above.

Figure 6B:
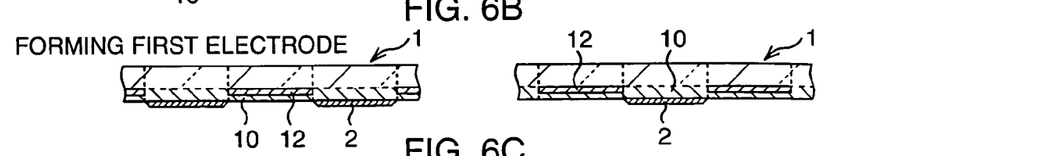

Then, as shown in FIG. 6B, a film of an indium tin oxide (ITO) alloy as a transparent electrode is deposited at the effective light emitting portion described above, and thus first electrodes 2 are formed.

Then, light emitting regions 11R, 11G, and 11B forming the pixels 21 are sequentially formed.

Figure 6C:
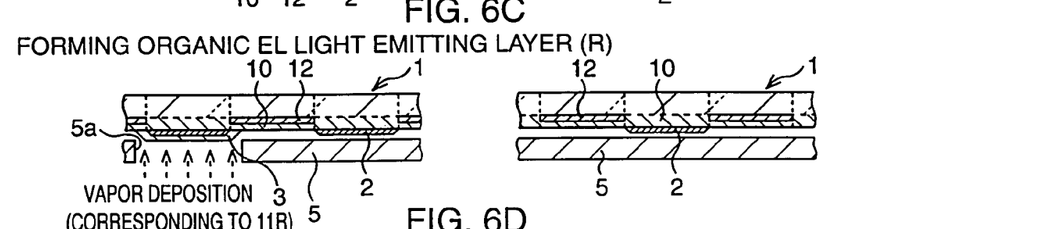

More specifically, as shown in FIG. 6C, a vapor deposition mask 5 with an opening 5a corresponding to a region to form a light emitting region is used. The vapor deposition mask 5 is placed on the surface of the glass substrate 1 so that the opening 5a is placed only in the position of the organic EL layer 3 corresponding to the light emitting region 11R, and the organic EL layer 3 corresponding to the light emitting region 11R is formed in the segment 22a by vapor deposition. At the time, the first electrode 2 is completely covered with the organic EL layer 3 for the light emitting region 11R, and the organic EL layer 3 does not overlap the first electrodes 2 for the other colors.

Figures 6D, 6E:
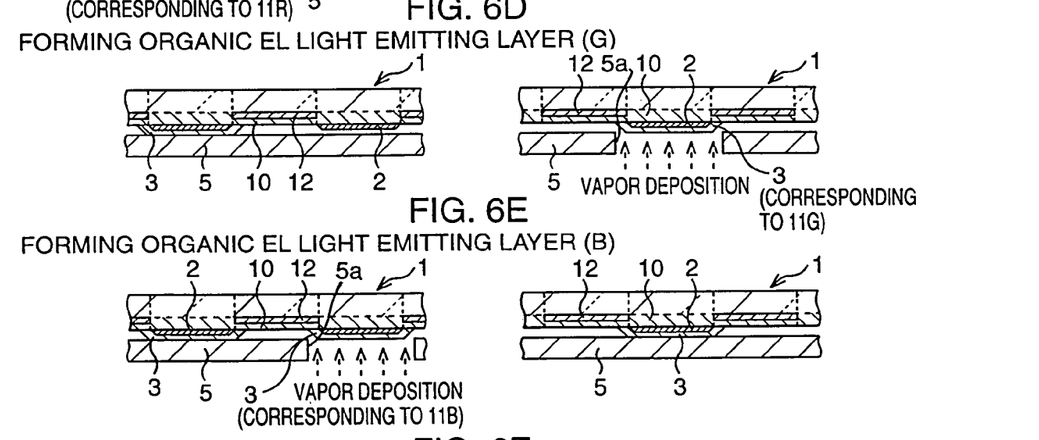

Then, as shown in FIG. 6D, using the same vapor deposition mask 5, the mask 5 is moved and placed on the surface of the glass substrate 1 so that the opening 5a is placed only in the position to form an organic EL layer 3 corresponding to the light emitting region 11G and the organic EL layer 3 corresponding to the light emitting region 11G is formed in the segment 22b by vapor deposition. At the time, the first electrode 2 is completely covered with the organic EL layer 3 for the light emitting region 11G, and the organic EL layer 3 does not overlap the first electrodes 2 for the other colors.

Then, as shown in FIG. 6E, using the same vapor deposition mask 5, the mask 5 is moved and placed on the surface of the glass substrate 1 so that the opening 5a is placed only in the position to form the organic EL layer 3 corresponding to the light emitting region 11B and the organic EL layer 3 corresponding to the light emitting region 11B is formed in the segment 22c by vapor deposition. At the time, the first electrode 2 is completely covered with the organic EL layer 3 for the light emitting region 11B, and the organic EL layer 3 does not overlap the first electrodes 2 for the other colors.

In this way, through the process steps in FIGS. 6C to 6E, C-chamfer shaped (or rounded) non-light emitting regions 13 are formed at the four corners of the light emitting regions 11R, 11G, and 11B. These non-light emitting regions 13 as well as the segments 23a to 23c for the TFT elements 12 are non-light emitting regions, the organic EL layers 3 are formed so that adjacent light emitting regions are kept from contacting one another in a pixel 21 and a plurality of such pixels 21 are provided in a matrix. The organic EL layers 3 corresponding to the light emitting regions 11R, 11G, and 11B are each formed to have an area greater than the corresponding first electrode 2 and cover the same, so that the registration margins for forming the light emitting regions can be secured. In addition, the TFT element region can be used for securing the registration margin necessary for achieving higher resolution. In this way, the aperture ratio can be improved.

The light emitting regions for the same colors are aligned with each TFT element 12 interposed therebetween so that the light emitting regions 11R, 11G, and 11B are evenly provided in a plane without contacting one another.

Figure 6F:
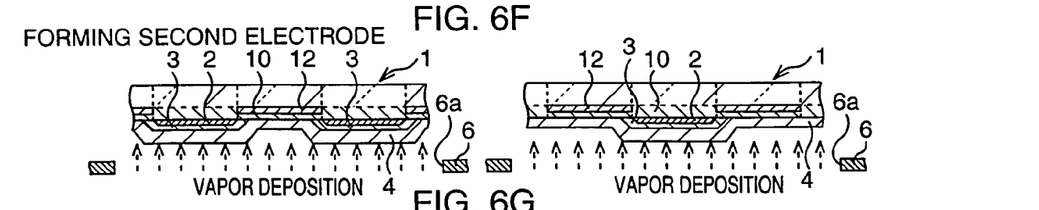

Then, as shown in FIG. 6F, a vapor deposition mask 6 with openings 6a to expose all the light emitting regions is used and placed on the surface of the glass substrate 1, and an aluminum alloy film is deposited by vapor deposition, thereby forming a second electrode 4 to cover all the light emitting regions.

Figure 6G:
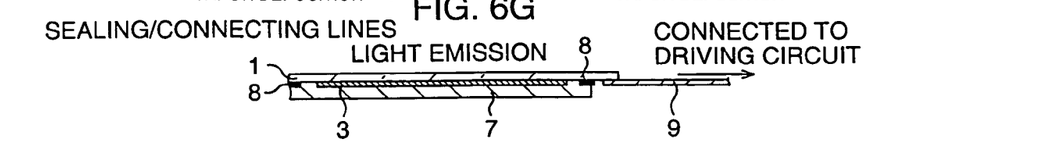

As shown in FIG. 6G, a plate 7 made of glass or the like that prevents moisture penetration is adhesively fixed, for example, with an adhesive 8 to cover the second electrode 4, so that the organic EL layers 3 are prevented from deteriorating by moisture and the like. Various conductive members formed on the glass substrate 1 are connected to a driving circuit (not shown) through the interconnection line 9 of an FPC (Flexible Printed Circuit).

Then, after various post-processing steps, a bottom emission type, active matrix organic EL display, for example, with a resolution of 160 ppi and an aperture ratio of 44.7% is produced.

As in the foregoing, according to the embodiment, at the time of manufacturing the organic EL display having the above-described configuration, mask vapor deposition technique is applied to form the organic EL layers 3 corresponding to the respective light emitting regions 11R, 11G, and 11B, and the same vapor deposition mask 5 is sequentially moved to form these light emitting regions. Therefore, the single vapor deposition mask 5 can readily be formed using a single film deposition chamber, low molecular organic EL can be deposited by vapor deposition, and an organic EL display having the above-described configuration can readily be provided with reliability.

Modifications of Embodiment

Now, modifications of the embodiment will be described.

Modification 1

Figure 7:
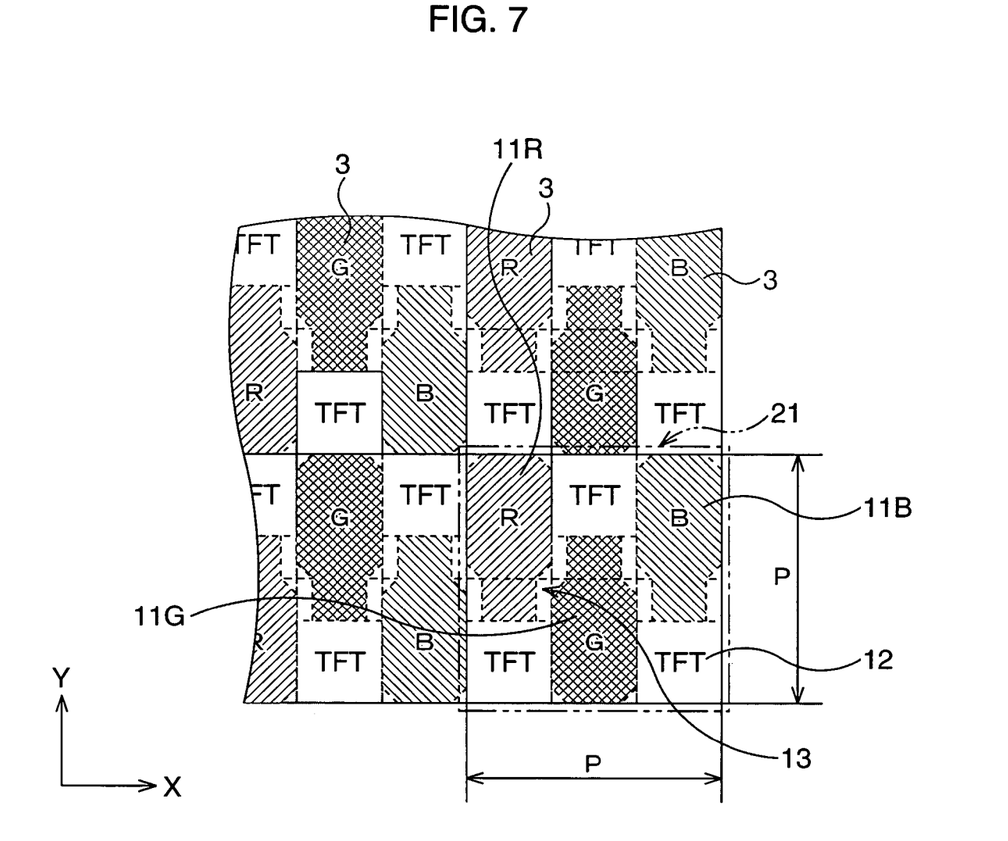
FIG. 7 is a schematic plan view of an organic EL light emitting layer, a main part of an organic EL display according to Modification 1, showing its surface as being enlarged.

FIG. 7 is a schematic plan view of an organic EL light emitting layer, a main part of an organic EL display according to Modification 1, showing its surface as being enlarged.

In the organic EL display, the areas of the light emitting regions 11R, 11G, and 11B in the pixel 21 are each greater than the area of the TFT element 12. In this case, the registration margins necessary for discrete coloring into the three colors can be included in the segments of the TFT elements 12, so that the aperture ratio can be increased.

Modification 2

Figure 8:
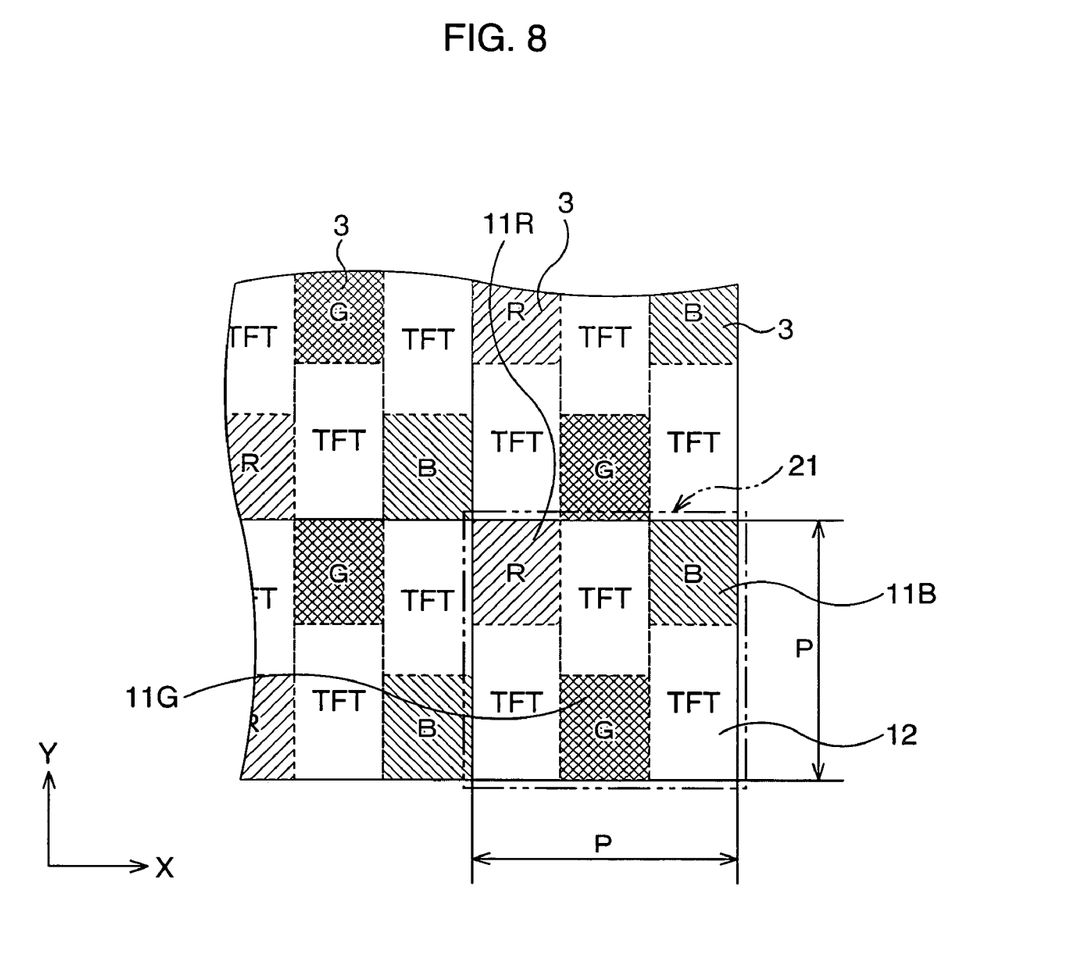
FIG. 8 is a schematic plan view of an organic EL light emitting layer, a main part of an organic EL display according to Modification 2.

FIG. 8 is a schematic plan view of an organic EL light emitting layer, a main part of an organic EL display according to Modification 2, showing its surface as being enlarged.

In this organic EL display, the areas of the light emitting regions 11R, 11G, and 11B in the pixel 21 are each smaller than the area of the TFT element 12. In this case, adjacent TFT elements 12 separate adjacent light emitting regions, and therefore there is no necessity for providing non-light emitting regions in association with the light emitting regions, so that the aperture ratio can be increased (in the shown example, the segments for the TFT elements 12 are in contact with each other).

INDUSTRIAL APPLICABILITY

According to the invention, a display device having a bottom emission type, active matrix organic EL panel that efficiently secures a sufficient aperture ratio, has pixel arrangement in which the aperture ratio is hardly a trade off for higher resolution, and can operate with reduced power consumption for obtaining necessary luminance and contribute to downsizing of the driving circuit and the device as a whole, and a manufacturing method that allows the configuration of such a device to be readily provided can be provided with reliability.

What is claimed is:

1. A display device having an active matrix organic EL panel comprising:
   first and second electrodes provided on a substrate, and an organic EL light emitting layer provided between said first and second electrodes, wherein
   said organic EL light emitting layer includes light emitting regions,
   each pixel of said display device including a plurality of groups each comprising one of said light emitting regions and a switching circuit that controls light emission from the light emitting region provided corresponding to said light emitting region,
   the light emitting region and the switching circuit of each of said groups being arranged such that said light emitting region abuts on the switching circuit of adjacent group, and said switching circuit abuts on the light emitting region of the adjacent group, and adjacent light emitting regions do not contact each other.

2. The display device according to claim 1, wherein, three kinds of said light emitting regions corresponding to R, G, and B and three switching circuits corresponding to the three kinds of said light emitting regions are arranged in a matrix, and
   in six segments arranged in a 2 by 3 matrix, said light emitting regions are arranged in three of said segments positioned in a zigzag manner and said three switching circuits are arranged in the three remaining segments.

3. The display device according to claim 2, wherein said light emitting regions for the same color are aligned with said switching circuit interposed therebetween.

4. The display device according to claim 1, wherein the area of said organic EL light emitting layer is greater than the area of said first electrode.

5. The display device according to claim 1, wherein a non-light emitting region is formed at a corner of said light emitting region, and adjacent ones of said light emitting regions are separated by said non-light emitting region.

6. The display device according to claim 1, wherein the area of said light emitting region is greater than the area of said switching circuit.

7. The display device according to claim 1, wherein said light emitting region has an area smaller than the area of said switching circuit and is separated from adjacent one of said light emitting regions with said switching circuit interposed therebetween.

* * * * *